(12) United States Patent
Furukawa

(10) Patent No.: US 11,842,915 B2
(45) Date of Patent: Dec. 12, 2023

(54) ELECTROSTATIC CHUCK

(71) Applicant: KYOCERA Corporation, Kyoto (JP)

(72) Inventor: Naoki Furukawa, Kagoshima (JP)

(73) Assignee: Kyocera Corporation, Kyoto (JP)

( * ) Notice: Subject to any disclaimer, the term of this patent is extended or adjusted under 35 U.S.C. 154(b) by 342 days.

(21) Appl. No.: 17/418,308

(22) PCT Filed: Jan. 23, 2020

(86) PCT No.: PCT/JP2020/002411
§ 371 (c)(1),
(2) Date: Jun. 25, 2021

(87) PCT Pub. No.: WO2020/153449
PCT Pub. Date: Jul. 30, 2020

(65) Prior Publication Data
US 2021/0391204 A1 Dec. 16, 2021

(30) Foreign Application Priority Data
Jan. 24, 2019 (JP) ................................. 2019-009961

(51) Int. Cl.
*H01L 21/683* (2006.01)
*H01J 37/32* (2006.01)

(52) U.S. Cl.
CPC .... *H01L 21/6833* (2013.01); *H01J 37/32697* (2013.01); *H01J 37/32733* (2013.01); *H01J 2237/2007* (2013.01)

(58) Field of Classification Search
CPC ............ H01L 21/6833; H01L 21/67109; H01J 37/32697; H01J 37/32733
See application file for complete search history.

(56) References Cited

U.S. PATENT DOCUMENTS

| | | |
|---|---|---|
| 2005/0011456 A1 | 1/2005 | Himori et al. |
| 2005/0042881 A1 | 2/2005 | Nishimoto et al. |
| 2009/0086401 A1 | 4/2009 | Samir et al. |
| 2013/0308244 A1 | 11/2013 | Shiraiwa et al. |
| 2014/0076500 A1* | 3/2014 | Honda ................. B32B 43/006 156/750 |

(Continued)

FOREIGN PATENT DOCUMENTS

| | | |
|---|---|---|
| JP | 2005-033181 A | 2/2005 |
| JP | 2006-344766 A | 12/2006 |

(Continued)

*Primary Examiner* — Adolf D Berhane
*Assistant Examiner* — Afework S Demisse
(74) *Attorney, Agent, or Firm* — Volpe Koenig

(57) ABSTRACT

An insulating substrate has a sample holding surface. A support is bonded to the insulating substrate. A first through-hole in the insulating substrate and a second through-hole in the support are continuous with each other to serve as a gas inlet. A porous member is located in the second through-hole. The second through-hole has, at its opening adjacent to the insulating substrate (opening adjacent to the substrate), a larger diameter than the first through-hole. The opening of the second through-hole and an electrostatic attraction electrode are at different positions in a direction parallel to the sample holding surface. The electrostatic attraction electrode and the second through-hole avoid overlapping each other as viewed from above.

6 Claims, 7 Drawing Sheets

(56) References Cited

U.S. PATENT DOCUMENTS

| | | |
|---|---|---|
| 2016/0276198 A1 | 9/2016 | Anada et al. |
| 2018/0025933 A1 | 1/2018 | Ishimura et al. |
| 2018/0358253 A1 | 12/2018 | Noh et al. |
| 2019/0287838 A1* | 9/2019 | Yamaguchi ....... H01L 21/68757 |

FOREIGN PATENT DOCUMENTS

| | | |
|---|---|---|
| JP | 2009-158917 A | 7/2009 |
| JP | 2013-243267 A | 12/2013 |
| JP | 2014-209615 A | 11/2014 |
| JP | 6489277 B1 | 3/2019 |
| KR | 10-2004-0066142 A | 7/2004 |
| KR | 20100044662 A | 4/2010 |
| KR | 10-2017-0113560 A | 10/2017 |
| KR | 10-2018-0135152 A | 12/2018 |
| WO | 2016/132909 A1 | 8/2016 |
| WO | 2017/213714 A1 | 12/2017 |
| WO | 2018/156556 A1 | 8/2018 |

\* cited by examiner

ELECTROSTATIC CHUCK

FIELD

The present disclosure relates to an electrostatic chuck for holding a sample such as a semiconductor wafer in manufacturing processes of semiconductor integrated circuits or liquid crystal displays.

BACKGROUND

A known sample holding tool used in, for example, a semiconductor manufacturing apparatus includes an electrostatic chuck described in Patent Literature 1.

CITATION LIST

Patent Literature

Patent Literature 1: Japanese Unexamined Patent Application Publication No. 2014-209615

BRIEF SUMMARY

An electrostatic chuck according to one or more aspects of the present disclosure includes a substrate being a plate and having a first main surface as a sample holding surface, an electrode for electrostatic attraction located inside the substrate, a bond material on a second main surface of the substrate, a support bonded to the second main surface of the substrate with the bond material, a first through-hole in the substrate extending from the sample holding surface to the second main surface, a second through-hole in the support being continuous with the first through-hole and extending from a surface of the support adjacent to the second main surface, and a porous member located in the second through-hole and fixed to the second main surface. The second through-hole has, at an opening of the second through-hole adjacent to the substrate, a larger diameter than the first through-hole. The opening of the second through-hole and the electrode are at different positions in a direction parallel to the sample holding surface.

DETAILED DESCRIPTION

The objects, features, and advantages of the present disclosure will become apparent from the following detailed description and the drawings.

An electrostatic chuck that forms the basis of an electrostatic chuck according to one or more embodiments of the present disclosure will now be described. The electrostatic chuck that forms the basis of the electrostatic chuck according to one or more embodiments of the present disclosure includes a dielectric substrate including inner electrodes and a metal base plate. The electrostatic chuck has through-holes extending through the dielectric substrate and the base plate. Each through-hole in the base plate receives a ceramic porous member.

Figure 1:
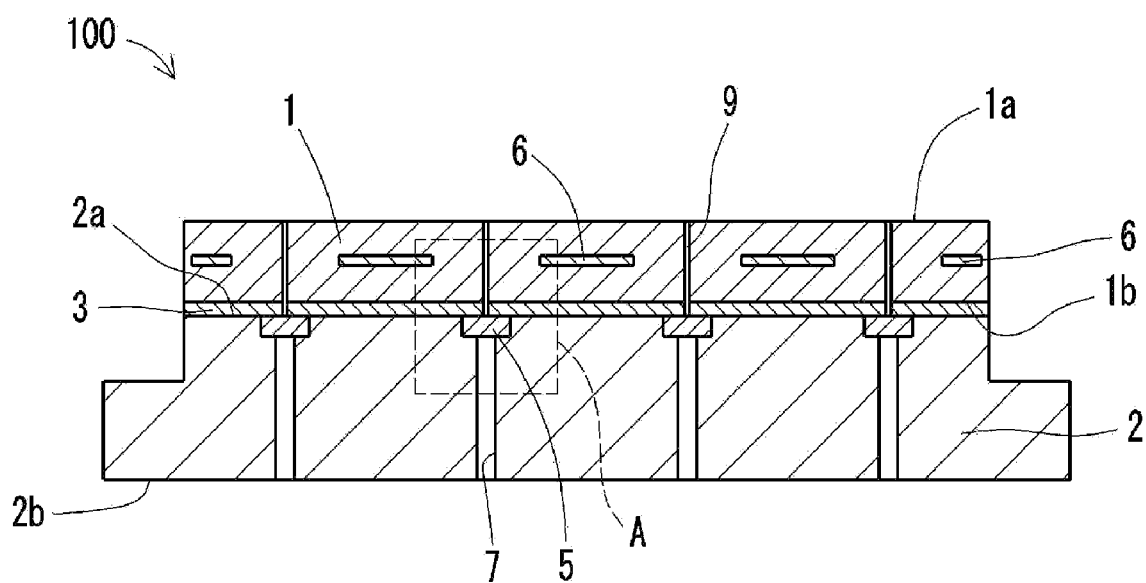
FIG. 1 is a cross-sectional view of an electrostatic chuck according to a first embodiment.
Figure 2:
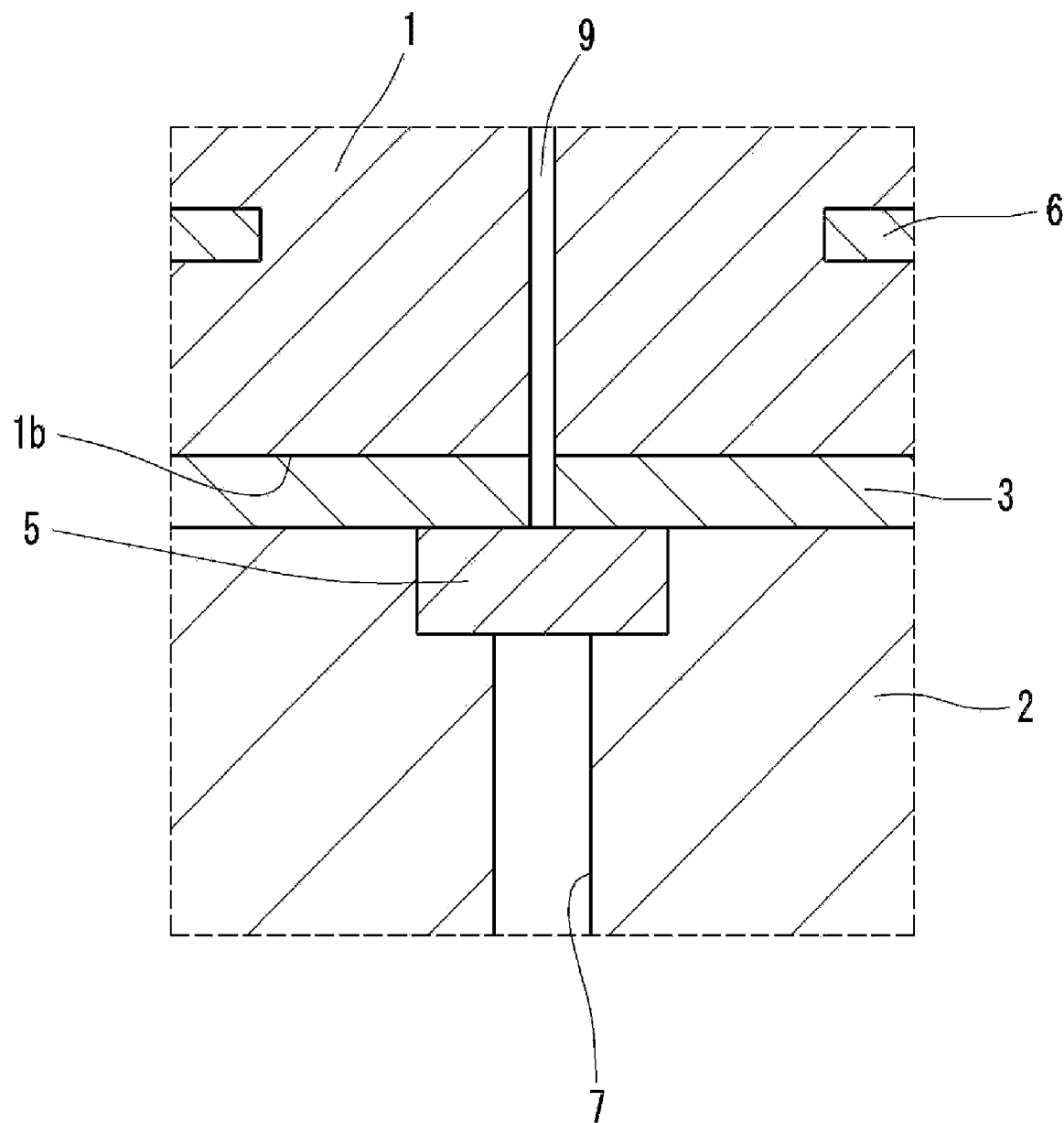
FIG. 2 is a partially enlarged cross-sectional view of area A including a porous member shown in FIG. 1.

An electrostatic chuck 100 will now be described with reference to the drawings. FIG. 1 is a cross-sectional view of an electrostatic chuck according to a first embodiment. FIG. 2 is a partially enlarged cross-sectional view of area A including a porous member shown in FIG. 1. The electrostatic chuck 100 includes an insulating substrate 1, a support 2, a bond material 3, porous members 5, and electrostatic attraction electrodes 6.

The insulating substrate 1 is a ceramic member having a first main surface 1a and a second main surface 1b opposite to the first main surface 1a. The first main surface 1a serves as a sample holding surface for holding a sample. The insulating substrate 1 is a plate with any outer shape that may be circular or rectangular.

The insulating substrate 1 is formed from, for example, a ceramic material. Examples of the ceramic material include alumina, aluminum nitride, silicon nitride, and yttria. The insulating substrate 1 may have outer dimensions including a diameter (or side length) of 200 to 500 mm and a thickness of 2 to 15 mm.

Various methods can be used for holding a sample with the insulating substrate 1. The electrostatic chuck 100 according to the present embodiment uses an electrostatic force to hold a sample. The electrostatic chuck 100 includes the electrostatic attraction electrodes 6 located inside the insulating substrate 1. The electrostatic attraction electrodes 6 include two different electrodes, one connected to the positive pole of a power supply, and the other connected to the negative pole of the power supply. For example, the two electrodes may be substantially semicircular and be located inside the insulating substrate 1 with their straight edges abutting each other. The electrostatic attraction electrodes 6 combining these two different electrodes have an entirely circular outer shape. The circular outer shape of the electrostatic attraction electrodes 6 can be coaxial with the circular outer shape of the ceramic member. The electrostatic attraction electrodes 6 may be in other shapes, or may be, for example, stripes, meandering, or in a grid. The electrostatic attraction electrodes 6 may contain a metal material. Examples of the metal material include platinum, tungsten, and molybdenum.

During operation, the electrostatic chuck 100 uses plasma generated above the first main surface 1a of the insulating substrate 1, which serves as the sample holding surface. The plasma may be generated by, for example, applying radio frequency waves between multiple external electrodes and exciting the gas between the electrodes.

The support 2 is formed from metal. The support 2 supports the insulating substrate 1. Examples of the metal material include aluminum. The support 2 may have any outer shape that may be circular or rectangular. The support 2 may have outer dimensions including a diameter (or side length) of 200 to 500 mm and a thickness of 10 to 100 mm. The support 2 may have the same outer shape and dimensions as the insulating substrate 1, or may have a different outer shape and dimensions.

The support 2 and the insulating substrate 1 are bonded together with the bond material 3. In detail, a first surface 2a of the support 2 and the second main surface 1b of the insulating substrate 1 are bonded together with the bond material 3. The bond material 3 may be a resin adhesive. Examples of the resin material include a silicone resin.

As shown in FIG. 2, the insulating substrate 1 has first through-holes 9 each extending from the first main surface 1a to the second main surface 1b. The support 2 has second through-holes 7 each extending from the first surface 2a to a second surface 2b opposite to the first surface 2a. The second through-hole 7 and the first through-hole 9 are continuous with each other and extend from the first main surface 1a of the insulating substrate 1, through the bond material 3, and to the second surface 2b of the support 2. The second through-hole 7 and the first through-hole 9 together serve as a gas inlet that receives a gas such as helium at the second surface 2b of the support 2 and allows the gas to flow toward the first main surface 1a of the insulating substrate 1, which serves as the sample holding surface.

The first through-hole 9 has a smaller diameter than the second through-hole 7 of the support 2 in at least a part of the insulating substrate 1. In the electrostatic chuck 100 according to the present embodiment, each second through-hole 7 is cylindrical and has different diameters at the second surface 2b and at the first surface 2a of the support 2. This will be described in detail later. The insulating substrate 1 has the first through-holes 9 that each are cylindrical and have a constant diameter from the second main surface 1b to the first main surface 1a.

The porous members 5 prevent plasma generated above the first main surface 1a as the sample holding surface from entering the first through-holes 9 toward the support 2. Examples of the porous members 5 include a ceramic porous material, such as alumina. The porous members 5 are located in the second through-holes 7. The porous members 5 have a porosity that allows gas to flow from the top to the bottom. The porous members 5 in the second through-holes 7 reduce the likelihood of the plasma reaching the support 2, while allowing the gas to flow through the first through-holes 9. The porous members 5 may have a porosity of, for example, 40 to 60%.

The electrostatic attraction electrodes 6 define, for example, a circular space (clearance) between them around each first through-hole 9. In the present embodiment, each second through-hole 7 has, at its opening adjacent to the insulating substrate 1 (opening adjacent to the substrate), a larger diameter than the corresponding first through-hole 9. The openings of the second through-holes 7 and the electrostatic attraction electrodes 6 are at different positions in a direction parallel to the sample holding surface. More specifically, the electrostatic attraction electrodes 6 and the second through-holes 7 may avoid overlapping each other as viewed from above (viewed in a direction perpendicular to the sample holding surface). For example, the clearance between the electrostatic attraction electrodes 6 may have the diameter larger than the opening diameter of the second through-hole 7. For the electrostatic attraction electrodes 6 that are strips, the distance between adjacent electrodes may be larger than the opening diameter. The porous member 5 is located at the opening of each second through-hole 7. The openings of the second through-holes 7 and the electrostatic attraction electrodes 6 are at such different positions to cause the porous members 5 to be more away from the electrostatic attraction electrodes 6 than in the structure that forms the basis of the electrostatic chuck according to one or more embodiments of the present disclosure. The porous members 5 and the electrostatic attraction electrodes 6 located more away from each other are less likely to cause dielectric breakdown than in the structure that forms the basis of the electrostatic chuck according to one or more embodiments of the present disclosure. The electrostatic attraction electrodes 6 being more away (or with a clearance having a larger diameter) are less likely to cause dielectric breakdown but can have accordingly smaller surface areas. For example, the electrostatic attraction electrodes 6 and the second through-holes 7 are at a distance of 0.5 to 4 mm as viewed from above.

The opening of each second through-hole 7 opposite to its opening adjacent to the substrate can have any size smaller than the opening diameter of the opening adjacent to the substrate. Each porous member 5 is pillar-shaped (cylindrical). Each second through-hole 7 has a cylindrical portion adjacent to the insulating substrate 1 to receive the porous member 5, from which a cylindrical hole with a smaller diameter continuously extends to the opposite surface. In other words, each second through-hole 7 includes the two cylindrical holes with different diameters connected coaxially with each other.

Figure 3:
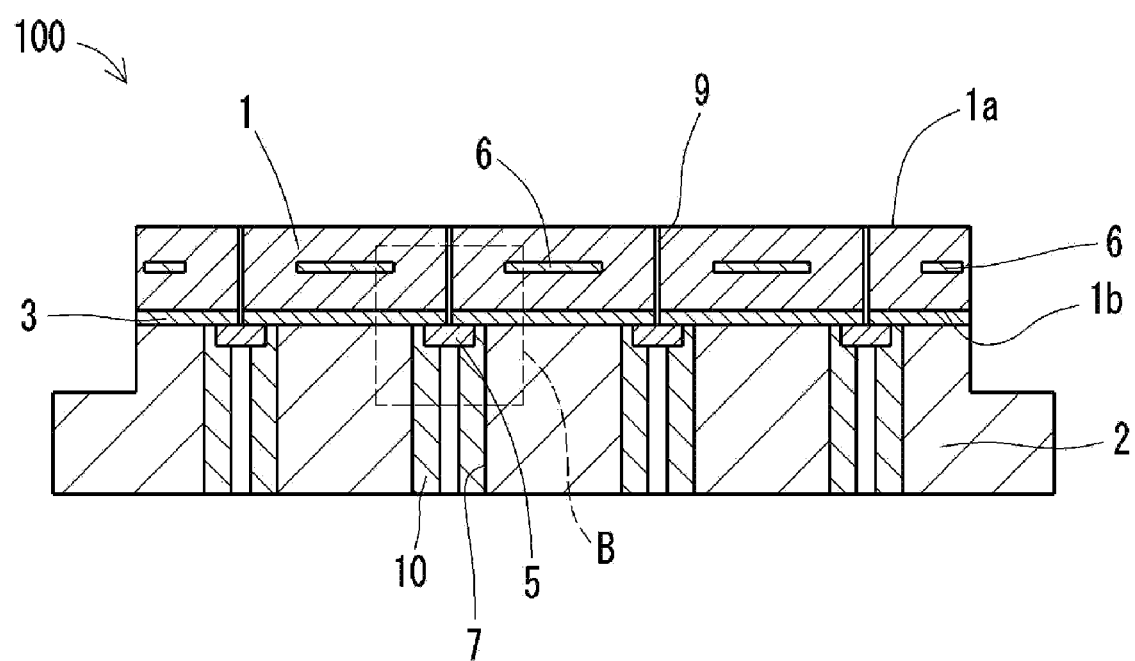
FIG. 3 is a cross-sectional view of an electrostatic chuck according to a second embodiment.
Figure 4:
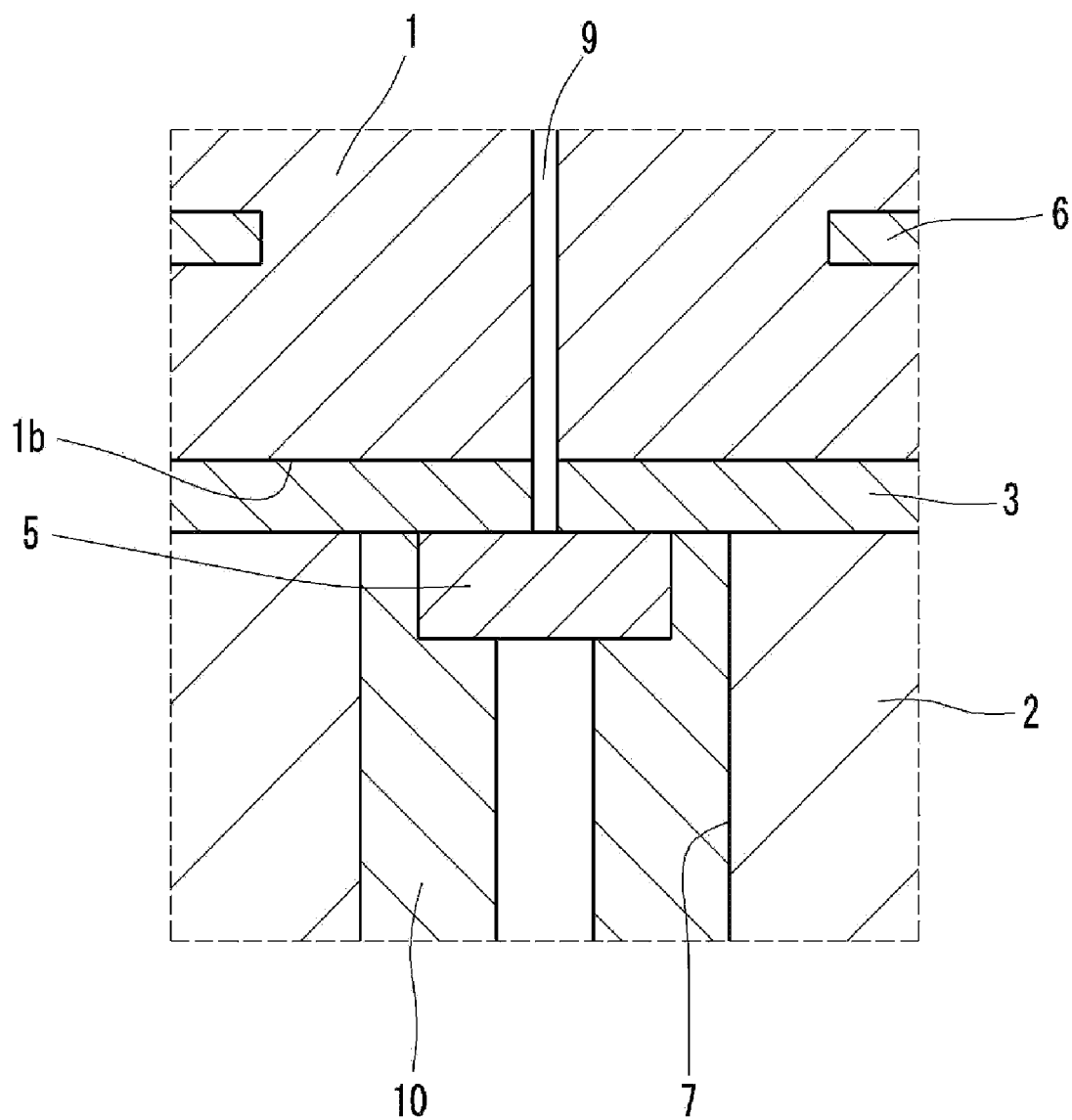
FIG. 4 is a partially enlarged cross-sectional view of area A including a porous member shown in FIG. 3.

FIG. 3 is a cross-sectional view of an electrostatic chuck according to a second embodiment. FIG. 4 is a partially enlarged cross-sectional view of area A including a porous member shown in FIG. 3. The electrostatic chuck 100 according to the present embodiment differs from the structure in the first embodiment in a sleeve 10 located in each second through-hole 7. The components of the electrostatic chuck 100 that are the same as in the first embodiment will not be described in detail.

Each sleeve 10 is cylindrical and extends along the center axis of the corresponding second through-hole 7. The sleeve 10 is a tubular member formed from an insulator. The sleeve 10 covers the metal material exposed at an inner peripheral surface of the second through-hole 7. The sleeve 10 located in the second through-hole 7 has its internal space continuous with the first through-hole 9, together serving as the gas inlet described above. Each porous member 5 is located at the opening of the corresponding sleeve 10 adjacent to the insulating substrate 1. The porous member 5 is surrounded by the sleeve 10. Upon receiving plasma reaching the porous member 5, the sleeve 10 prevents a short-circuit from being formed with the support 2 or prevents plasma discharge onto the support 2.

Unlike in the first embodiment, the cylindrical second through-hole 7 in the present embodiment has a constant hole diameter. The outer diameter of the sleeve 10 is the same as the hole diameter of the second through-hole 7. The sleeve 10 includes two cylindrical holes with different diameters connected coaxially with each other, in the same manner as the second through-hole 7 in the first embodiment. The sleeve 10 receives the porous member 5 in the larger-diameter hole adjacent to the insulating substrate 1.

The sleeve 10 may be formed from, for example, a ceramic material. Examples of the ceramic material include alumina and aluminum nitride.

In the same manner as in the first embodiment, the openings of the second through-holes 7 and the electrostatic attraction electrodes 6 are at different positions in a direction parallel to the sample holding surface in the present embodiment. This structure is less likely to cause dielectric breakdown. The opening of each second through-hole 7 is larger than in the first embodiment by the thickness of the sleeve 10 that surrounds the porous member 5. The porous members 5 are thus more away from the electrostatic attraction electrodes 6.

Figure 5:
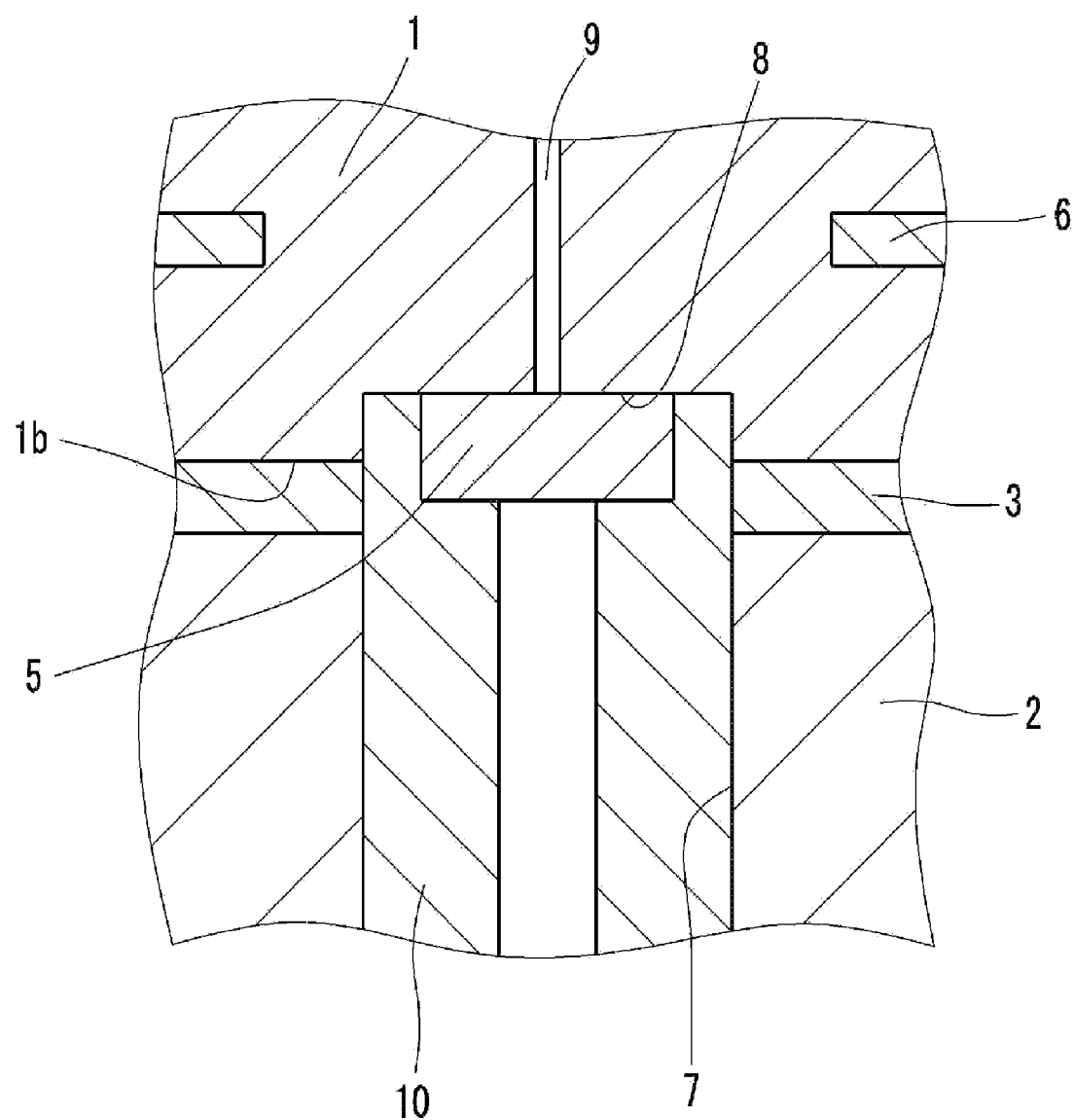
FIG. 5 is a partially enlarged cross-sectional view of an area including a porous member in a third embodiment.

FIG. 5 is a partially enlarged cross-sectional view of an area including a porous member in a third embodiment. The present embodiment differs from the second embodiment in that the insulating substrate 1 has, on the second main surface 1b, a recess 8 that is cylindrical. The recess 8 has a depth toward the first main surface 1a and has the same diameter as the outer diameter of the sleeve 10.

The recess 8 has the central axis coaxial with the central axis of the first through-hole 9. The recess 8 receives an upper part of the sleeve 10 in a manner fitted in the recess 8 and protruding further toward the insulating substrate 1 from the first surface 2a of the support 2. This structure allows the inner space of the sleeve 10, which is a part of the gas inlet, to be easily coaxial with the center axis of the first through-hole 9. The porous member 5 and the sleeve 10 have the upper surfaces located at a distance from the first surface 2a of the support 2. This structure prevents a short-circuit from being formed with the support 2 or prevents plasma discharge onto the support 2. The recess 8 allows the first through-hole 9 to be shorter and thus reduces the likelihood of plasma being generated in the first through-hole 9.

Figure 6:
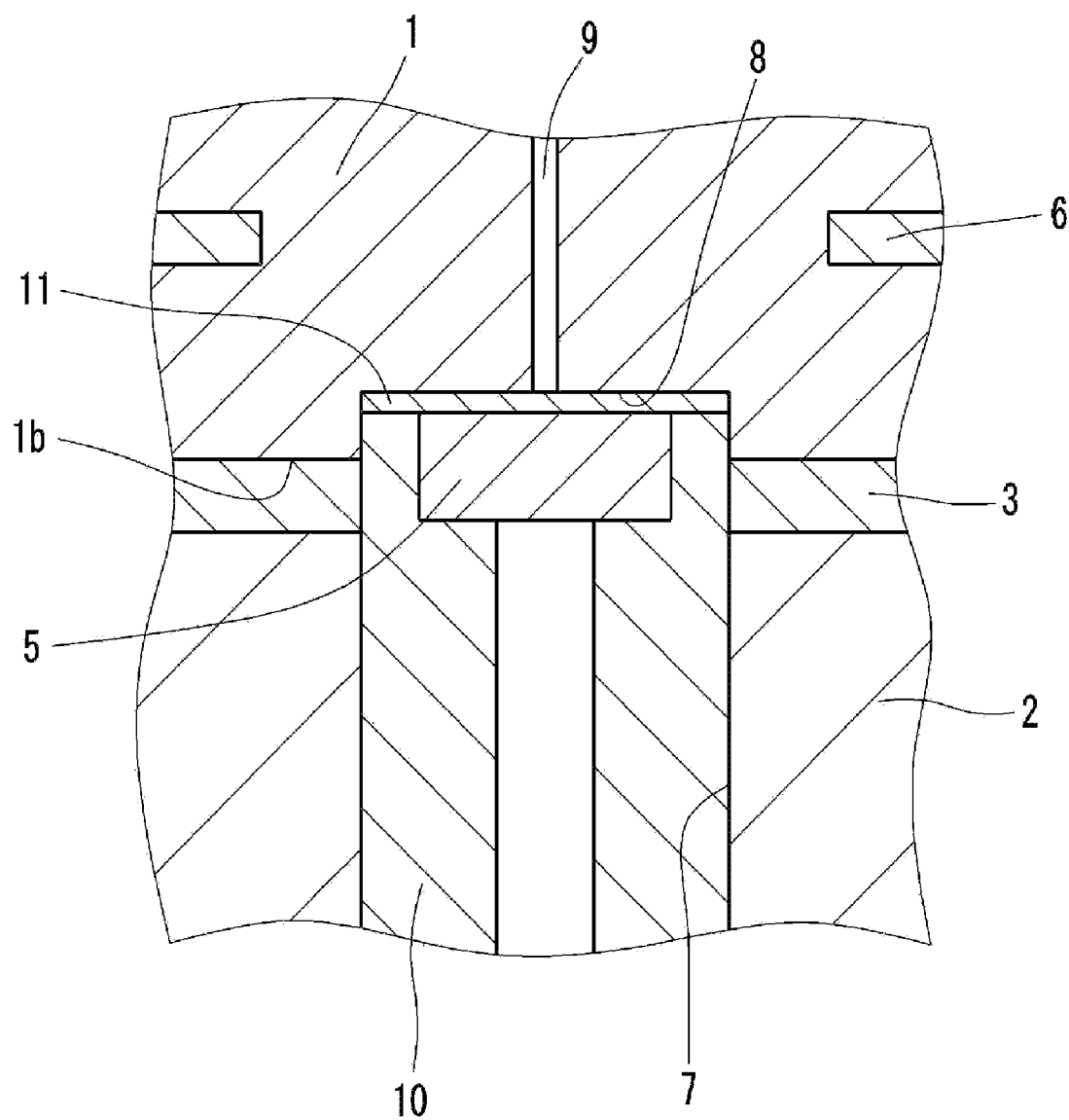
FIG. 6 is a partially enlarged cross-sectional view of an area including a porous member in a fourth embodiment.

FIG. 6 is a partially enlarged cross-sectional view of an area including a porous member in a fourth embodiment. The present embodiment differs from the third embodiment in that the porous member 5 is fixed in the recess 8 with an adhesive 11.

The adhesive 11 to fix the porous member 5 to the insulating substrate 1 in the recess 8 is formed from a material having higher thermal conductivity than the insulating substrate 1. Examples of the material include a silicone resin. Heat generated with plasma in processing wafers is transferred from the insulating substrate 1 to the support 2. In an area around the recess 8 without the electrostatic attraction electrodes 6, the electrostatic attraction is weak and can cause small gaps between the wafer and the sample holding surface of the insulating substrate 1, partially lowering thermal conductivity. The adhesive 11 formed from the material with higher thermal conductivity is used in this area to partially increase thermal conductivity and compensate for the thermal conductivity lowered by the weak electrostatically attraction, thus allowing uniform heat transfer. The adhesive 11 may be located in areas other than immediately below the first through-hole 9. The gas flowing from the second through-hole 7 through the porous member 5 can thus be efficiently directed into the first through-hole 9.

Figure 7:
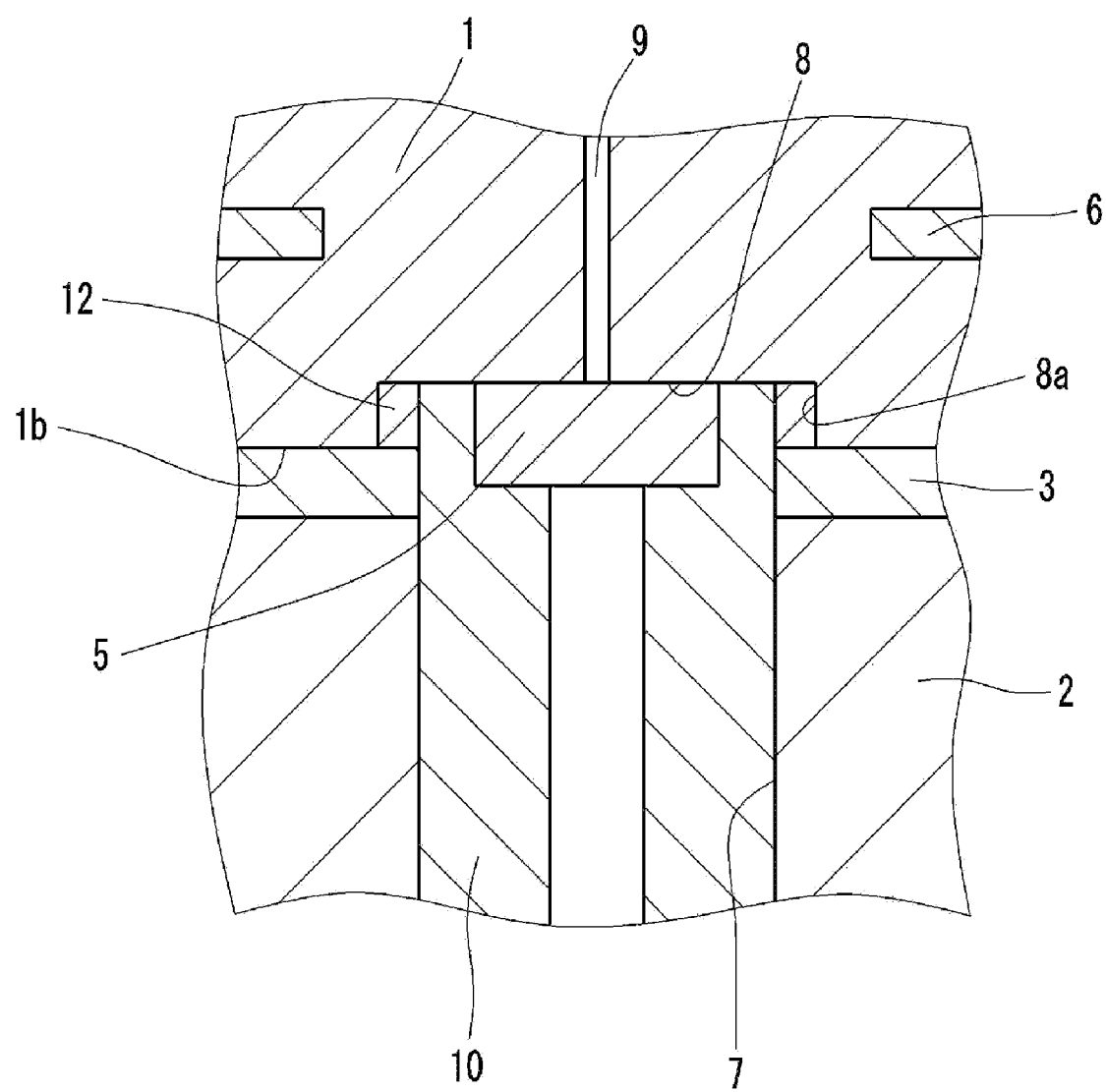
FIG. 7 is a partially enlarged cross-sectional view of an area including a porous member in a fifth embodiment.

FIG. 7 is a partially enlarged cross-sectional view of an area including a porous member in a fifth embodiment. The present embodiment differs from the third embodiment in that the recess 8 has a wall surface 8a adjacent to a plasma-resistant member 12.

In the present embodiment, the recess 8 has a diameter slightly larger than the outer diameter of the sleeve 10. The plasma-resistant member 12 is between an outer peripheral surface of a part of the sleeve 10 fitted in the recess 8 and the wall surface 8a of the recess 8. The plasma-resistant member 12 is located at an internal corner joining the bottom surface of the recess and the wall surface 8a, where stress is likely to concentrate. This structure further reduces dielectric breakdown.

The plasma-resistant member 12 can be formed from, for example, a resin material that does not easily deteriorate under plasma, such as a fluorine resin. The plasma-resistant member 12 can adhesively fix the sleeve 10 and the recess 8, or the sleeve 10 and the insulating substrate 1.

A method for manufacturing a sample holding tool according to the fifth embodiment will be described briefly. The porous member 5 is first attached at the opening of the sleeve 10. The sleeve 10 is fitted into the second through-hole 7 of the support 2. The insulating substrate 1 and the support 2 are then bonded with the bond material 3. The porous member 5 is fixed to the insulating substrate 1 with the adhesive 11, and the sleeve 10 is fixed to the insulating substrate 1 with the plasma-resistant member 12.

The present disclosure may be implemented in the following form.

An electrostatic chuck according to one embodiment of the present disclosure includes a substrate being a plate and having a first main surface as a sample holding surface, an electrode for electrostatic attraction located inside the substrate, a bond material on a second main surface of the substrate, a support bonded to the second main surface of the substrate with the bond material, a first through-hole in the substrate extending from the sample holding surface to the second main surface, a second through-hole in the support continuous with the first through-hole and extending from a surface of the support adjacent to the second main surface, and a porous member located in the second through-hole and fixed to the second main surface. The second through-hole has, at an opening of the second through-hole adjacent to the substrate, a larger diameter than the first through-hole. The opening of the second through-hole and the electrode are at different positions in a direction parallel to the sample holding surface.

The electrostatic chuck according to one or more embodiments of the present disclosure has a relatively long distance between the opening of the second through-hole in the support and the electrodes in the substrate to reduce dielectric breakdown.

REFERENCE SIGNS LIST

1 insulating substrate
1a first main surface
1b second main surface
2 support
2a first surface
2b second surface
3 bond material
5 porous member
6 electrostatic attraction electrode
7 second through-hole
8 recess
9 first through-hole
10 sleeve
11 adhesive
12 plasma-resistant member
100 sample holding tool

The invention claimed is:
1. An electrostatic chuck, comprising:
a substrate having a first main surface for holding a sample, a second main surface, and a first through-hole extending from the first main surface to the second main surface;
an electrode for electrostatic attraction located inside the substrate;
a bond material on the second main surface of the substrate that bonds a support to the second main surface;
the support having a second through-hole that is continuous with the first through-hole, and that extends from a surface of the support adjacent to the second main surface; and
a porous member located in the second through-hole and fixed to the second main surface, wherein a diameter of the second through-hole, at an opening of the second through-hole adjacent to the substrate, is larger than a diameter of the first through-hole, and the opening of the second through-hole and the electrode are at different positions in a direction parallel to the first main surface.

2. The electrostatic chuck according to claim 1, further comprising:

a tubular member located in the second through-hole and surrounding the porous member.

3. The electrostatic chuck according to claim 1, wherein the substrate has a recess on the second main surface, and the porous member is fixed in the recess.

4. The electrostatic chuck according to claim 3, wherein the porous member is fixed in the recess with an adhesive, and a thermal conductivity of the adhesive is higher than a thermal conductivity of the substrate.

5. The electrostatic chuck according to claim 3, wherein the recess and the electrode are at different positions in the direction parallel to the first main surface.

6. The electrostatic chuck according to claim 3, wherein the recess has a wall, and the electrostatic chuck comprises a plasma-resistant member on the wall.

* * * * *